United States Patent
Xie et al.

(10) Patent No.: US 10,217,774 B2
(45) Date of Patent: Feb. 26, 2019

(54) THIN FILM TRANSISTOR AND MANUFACTURING METHOD THEREOF, ARRAY SUBSTRATE, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenyu Xie, Beijing (CN); Shaoying Xu, Beijing (CN); Tiansheng Li, Beijing (CN); Changjiang Yan, Beijing (CN); Jing Li, Beijing (CN); Zongmin Tian, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/625,436

(22) Filed: Jun. 16, 2017

(65) Prior Publication Data
US 2017/0287950 A1 Oct. 5, 2017

Related U.S. Application Data

(63) Continuation of application No. 14/087,626, filed on Nov. 22, 2013, now abandoned.

(30) Foreign Application Priority Data

Dec. 21, 2012 (CN) .......................... 2012 1 0564245

(51) Int. Cl.
*H01L 27/12* (2006.01)
*H01L 29/786* (2006.01)
*H01L 29/66* (2006.01)

(52) U.S. Cl.
CPC ...... *H01L 27/1248* (2013.01); *H01L 27/1225* (2013.01); *H01L 29/66969* (2013.01); *H01L 29/7869* (2013.01); *H01L 29/78606* (2013.01)

(58) Field of Classification Search
CPC ................................... H01L 27/1248
See application file for complete search history.

(56) References Cited

U.S. PATENT DOCUMENTS 5,370,969 A * 12/1994 Vidusek .................. G03F 7/094
  257/E21.035
10,062,868 B2 * 8/2018 Cheng ................. H01L 51/5275
(Continued)

FOREIGN PATENT DOCUMENTS

CN    101752426 A    6/2010
CN    102646716 A    8/2012
(Continued)

OTHER PUBLICATIONS

First Chinese Office Action dated Feb. 1, 2016; Appln. No. 201210564245.8.
Second Chinese Office Action dated Jul. 29, 2016: Appln. No. 201210564245.8.
Third Chinese Office Action dated Oct. 31, 2016; Appln. No. 201210564245.8.
Korean Office Action dated Dec. 29, 2014; Appln. No. 10-2013-0158174.
(Continued)

*Primary Examiner* — Lex H Malsawma
(74) *Attorney, Agent, or Firm* — Ladas & Parry LLP

(57) ABSTRACT

The technical disclosure relates to a thin film transistor and a manufacturing method thereof, an array substrate and a display device. The thin film transistor comprises a base substrate, a gate electrode, an active layer, source/drain electrodes, a pixel electrode and one or more insulating layers, wherein at least one of the insulating layers comprises a bottom insulating sub-layer and a top insulating sub-layer, the top insulating sub-layer having a hydrogen content higher than that of the bottom insulating sub-layer.

10 Claims, 4 Drawing Sheets

(56) References Cited

U.S. PATENT DOCUMENTS

| | | |
|---|---|---|
| 2009/0065784 A1 | 3/2009 | Kobayashi et al. |
| 2010/0025675 A1 | 2/2010 | Yamazaki et al. |
| 2010/0133525 A1 | 6/2010 | Arai et al. |
| 2011/0111186 A1* | 5/2011 | Nam .................. C23C 16/345 428/195.1 |
| 2011/0297930 A1 | 12/2011 | Choi et al. |
| 2012/0045904 A1 | 2/2012 | Choi |
| 2012/0211755 A1 | 8/2012 | Fujimori et al. |
| 2013/0015438 A1 | 1/2013 | Yamazaki |
| 2013/0082252 A1 | 4/2013 | Yamazaki |
| 2013/0207110 A1* | 8/2013 | Seo .................. H01L 29/786 257/57 |
| 2013/0302999 A1* | 11/2013 | Won .................. H01L 21/0262 438/787 |
| 2013/0320339 A1 | 12/2013 | Kawashima et al. |
| 2014/0084282 A1 | 3/2014 | Cao et al. |
| 2014/0110702 A1 | 4/2014 | Cheng et al. |
| 2016/0260602 A1* | 9/2016 | Sreekala .................. C23C 16/24 |

FOREIGN PATENT DOCUMENTS

| | | |
|---|---|---|
| CN | 102683422 A | 9/2012 |
| CN | 202423298 U | 9/2012 |
| JP | 2006-202901 A | 8/2006 |
| JP | 2007-073562 A | 3/2007 |
| JP | 2010-056546 A | 3/2010 |
| JP | 2011-258949 A | 12/2011 |
| KR | 1020080104756 A | 12/2008 |
| KR | 1020120110040 A | 10/2012 |

OTHER PUBLICATIONS

Korean Office Action dated Jan. 25, 2016; Appln No. 10-2013-0158174.
Korean Office Action dated Mar. 8, 2016; Appln. No. 10-2013-0158174.
Korean Office Action dated May 23, 2016; Appln. No. 10-2016-0043290.
Korean Office Action dated Jul. 31, 2015; Appln. No. 10-2013-0158174.
Extended European Search Report dated Feb. 28, 2014; Appln. No. 13193776.5-1508.
EPO Office Action dated Jun. 1, 2016; Appln. No. 13 193 776.5-1504.
USPTO NFOA dated Sep. 4, 2014 in connection with U.S. Appl. No. 14/087,626.
USPTO FOA dated Mar. 27, 2015 in connection with U.S. Appl. No. 14/087,626.
USPTO NFOA dated Oct. 8, 2015 in connection with U.S. Appl. No. 14/087,626.
USPTO FOA dated May 13, 2016 in connection with U.S. Appl. No. 14/087,626.
USPTO NFOA dated Sep. 7, 2016 in connection with U.S. Appl. No. 14/087,626.
USPTO FOA dated Mar. 17, 2017 in connection with U.S. Appl. No. 14/087,626.
Japanese Office Action dated Aug. 21, 2017; Appln. 2013-247184.
The Second Japanese Office Action dated Dec. 11, 2017; Appln. No. 2013-247184.

* cited by examiner

THIN FILM TRANSISTOR AND MANUFACTURING METHOD THEREOF, ARRAY SUBSTRATE, AND DISPLAY DEVICE

TECHNICAL FIELD

Embodiments of the present technical disclosure relate to a thin film transistor (TFT) technology in the field of liquid crystal display.

BACKGROUND

FIG. 1 shows a structure of a traditional oxide semiconductor thin film transistor (oxide thin film transistor). As shown in FIG. 1, the traditional oxide thin film transistor comprises, sequentially from bottom up, a base substrate 10, a gate electrode 11, a gate insulating layer 12, an active layer 13, an etch stop layer 14, source/drain electrodes 15, a protective layer 16 and a pixel electrode 17.

FIGS. 2 (a) to 2 (g) show a traditional method of manufacturing the oxide thin film transistor. As shown in FIG. 2 (a), the traditional manufacturing method comprises firstly forming the gate electrode 11 on the base substrate 10; as shown in FIG. 2 (b), forming the gate insulating layer 12, which covers the substrate 10 and the gate electrode 11; as shown in FIG. 2 (c), forming the active layer 13 on the gate insulating layer 12 corresponding to the gate electrode 11, the active layer 13 being made of an oxide semiconductor material (e.g., indium gallium zinc oxide (IGZO)); as shown in FIG. 2 (d), forming the etch stop layer 14 on the active layer 13; as shown in FIG. 2 (e), forming the source/drain electrodes 15 on the etch stop layer 14; as shown in FIG. 2 (f), then forming the protective layer 16 to cover the source/drain electrodes 15, the etch stop layer 14 and the gate insulating layer 12; and as shown in FIG. 2 (g), finally forming the pixel electrode 17 on the source/drain electrode 15 and the protective layer 16.

Compared with the process of manufacturing the amorphous silicon (a-Si) thin film transistor, the process of manufacturing the oxide thin film transistor has an additional process for forming the etch stop layer (i.e., the step shown in FIG. 2 (d)). The characteristics of the oxide thin film have greatly affected by the interfacial characteristics, especially the thin film deposition process of the etch stop layer, which requires for example the silicon oxide thin film manufactured in the process for forming the etch stop layer to maintain a low content of hydrogen, generally lower than 6%; in contrast, in the amorphous silicon thin film transistor, the silicon nitride thin film has a hydrogen content of about 20%. On one hand, the purpose of the process for forming the etch stop layer is to prevent the etchant from corroding the active layer when performing etching process on the source/drain electrodes; on the other hand, the etch stop layer is usually formed by the silicon oxide materials, and in order to maintain a low hydrogen content of the silicon oxide thin film, the plasma enhanced chemical vapor deposition (PECVD) method is usually adopted to deposit the silicon oxide thin film. When the PECVD method is used, the hydrogen ions generated by silane decomposition are prone to react with In, Zn, O in the metal oxides (e.g., IGZO) in the active layer, affecting the characteristics of the IGZO thin film. Accordingly, the currently adopted solution is to lower the deposition temperature to about 200□, but it may increase the hydrogen content in the deposited silicon oxide thin film in the condition that the reaction gas has a constant flow rate, and thus the stability of the thin film is deteriorated and the deposition rate of the thin film is reduced.

SUMMARY

One aspect of the present technical disclosure provides a thin film transistor, which comprises a base substrate, a gate electrode, an active layer, source/drain electrodes, a pixel electrode and one or more insulating layers; at least one of the insulating layers comprises a bottom insulating sub-layer and a top insulating sub-layer, and the top insulating sub-layer has a hydrogen content higher than that of the bottom insulating sub-layer.

For example, the thin film transistor is an oxide thin film transistor, which comprises a plurality of insulating layers; the insulating layers comprises a gate insulating layer, an etch stop layer and a protective layer, the etch stop layer comprises a bottom etch stop layer as the bottom insulating sub-layer and a top etch stop layer as the top insulating sub-layer, and the top etch stop layer has a hydrogen content higher than that of the bottom etch stop layer.

For example, in the oxide thin film transistor, the hydrogen content of the top etch stop layer is 5%~10%, and the hydrogen content of the bottom etch stop layer is 1%~5%.

For example, in the oxide thin film transistor, the gate electrode is disposed on the base substrate; the gate insulating layer covers the substrate and the gate electrode; the active layer is disposed on the gate insulating layer corresponding to the gate electrode; the bottom etch stop layer is disposed on the active layer; the top etch stop layer is disposed on the bottom etch stop layer; the source/drain electrodes are disposed on the top etch stop layer; the protective layer covers the gate insulating layer, the source/drain electrodes and the top etch stop layer; and the pixel electrode is disposed on the source/drain electrodes and the protective layer.

For example, in the oxide thin film transistor, the bottom etch stop layer has a thickness of 200-1000 Å, and the top etch stop layer has a thickness of 1000-1500 Å.

For example, in the thin film transistor, the active layer is made of indium gallium zinc oxide semiconductor or indium zinc oxide semiconductor.

For example, in the thin film transistor, the active layer is deposited by magnetron sputtering.

Another aspect of the present technical disclosure provides an array substrate, which comprises the aforementioned thin film transistor.

Further another aspect of the present technical disclosure provides a display device, which comprises the aforementioned array substrate.

Still further aspect of the present technical disclosure provides a method of manufacturing a thin film transistor, comprising: forming a gate electrode, an active layer, source/drain electrodes, one or more insulating layers and a pixel electrode on a base substrate, and sequentially forming a bottom insulating sub-layer and a top insulating sub-layer when forming at least one of the insulating layers such that the top insulating sub-layer has a hydrogen content higher than that of the bottom insulating sub-layer.

For example, the thin film transistor is an oxide thin film transistor, the at least one of the insulating layers comprises an etch stop layer, and the manufacturing method comprises: sequentially forming the gate electrode, a gate insulating layer, the active layer, an etch stop layer, the source/drain electrodes, a protective layer, and the pixel electrode on a base substrate, and sequentially forming a bottom etch stop layer as the bottom insulating sub-layer and a top etch stop layer as the top insulating sub-layer when forming the etch stop layer such that the top etch stop layer has a hydrogen content higher than that of the bottom etch stop layer.

For example, the manufacturing method comprises: forming the gate electrode on the base substrate; forming the gate insulating layer covering the base substrate and the gate electrode; forming the active layer on the gate insulating layer corresponding to the gate electrode; forming the bottom etch stop layer on the active layer; forming the top etch stop layer on the bottom etch stop layer; forming the source/drain electrodes on the top etch stop layer; forming the protective layer covering the gate insulating layer, the source/drain electrodes and the top etch stop layer; and forming the pixel electrode on the source/drain electrodes and the protective layer.

For example, in the method, the bottom etch stop layer is deposited at 200-300° C. with a silane gas flow rate of 300-800 sccm; the top etch stop layer is deposited at 240-340° C. with a silane gas flow rate of 600-1200 sccm.

For example, in the method, the bottom etch stop layer is deposited with a thickness of 200-1000 Å, and the top etch stop layer is deposited with a thickness of 1000-1500 Å.

For example, in the method, the active layer is made of indium gallium zinc oxide semiconductor or indium zinc oxide semiconductor.

For example, in the method, the active layer is deposited by magnetron sputtering.

Further scope of applicability of the present technical disclosure will become apparent from the detailed description given hereinafter. However, it should be understood that the detailed description and specific examples, while indicating preferred embodiments of the technical disclosure, are given by way of illustration only, since various changes and modifications within the spirit and scope of the technical disclosure will become apparent to those skilled in the art from the following detailed description.

BRIEF DESCRIPTION OF THE DRAWINGS

The present technical disclosure will become more fully understood from the detailed description given hereinafter and the accompanying drawings which are given by way of illustration only, and thus are not limitative of the present technical disclosure and wherein.

REFERENCE SIGNS 10, 20—substrate; 11, 21—gate electrode; 12, 22—gate insulating layer; 13, 23—active layer; 14—etch stop layer; 24a bottom etch stop layer as the bottom insulating sub-layer; 24b—top etch stop layer; 15, 25—source/drain electrodes; 16, 26—protective layer; 17, 27—pixel electrode.

DETAILED DESCRIPTION

According to the traditional TFT manufacturing process in the background portion of the present disclosure, it becomes a problem to be solved in the related technical field how to improve the structure and manufacturing process of the oxide thin film transistor, e.g., to lower the hydrogen content in the silicon oxide thin film for the etch stop layer, to maintain excellent characteristics of the oxide thin film transistor, and to improve the deposition rate of the thin film of the etch stop layer.

In one embodiment of the present technical disclosure, at lease one insulating layer of the thin film transistor is manufactured by a double-layer structure process, i.e., to manufacture the bottom insulating sub-layer and the top insulating sub-layer respectively, so that different process conditions can be used to manufacture the bottom insulating sub-layer and the top insulating sub-layer according to the properties of the insulating layer thin film.

The thin film transistor and the manufacturing method thereof according to the embodiments of the present technical disclosure will be herein described in details with reference to the drawings by taking the etch stop layer in the oxide thin film layer as an example.

Unless otherwise defined, the technical or scientific terms used herein shall have the general meanings understandable for those ordinarily skilled in the field of the present technical disclosure. The words such as "a", "an", "the" or the like shall not represent limitation of numbers, but mean existence of at least one. The words "comprise", "include" or the like intend to mean the elements or objects before such words cover or are equivalent to the elements or objects listed after such words, but other elements or objects are not exclusive. The words "joint", "connect" or the like are not limited to physical or chemical connection, but also comprise electrical connection, no matter directly or indirectly. The words "upper", "lower", "left", "right" and etc. shall be used only to represent relative positions, wherein, when the absolute position of the described object is changed, the relative positions may be changed accordingly.

Figure 3:
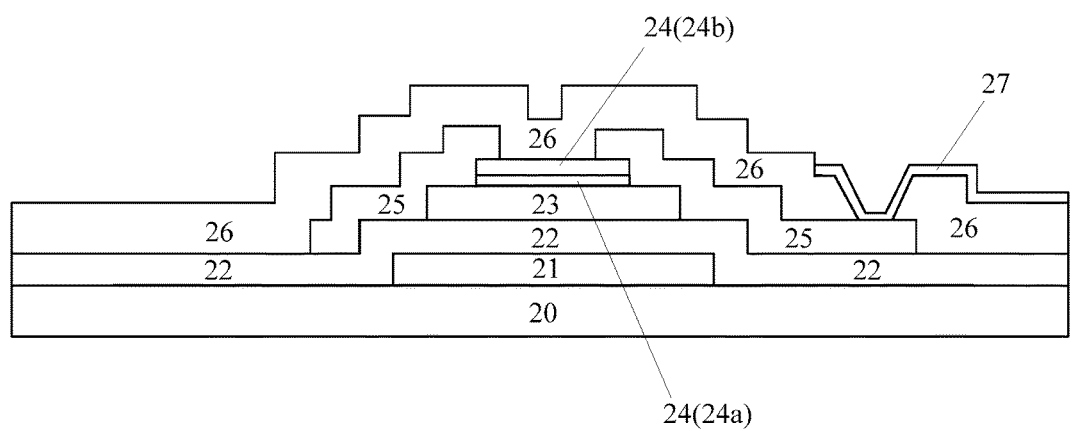
FIG. 3 is a structural schematic view of an oxide thin film transistor according to an embodiment of the present technical disclosure.

FIG. 3 shows the structure of the oxide thin film transistor in one embodiment of the present technical disclosure. As shown in FIG. 3, the oxide thin film transistor of the present embodiment comprises: a base substrate 20, a gate electrode 21, a gate insulating layer 22, an active layer 23, an etch stop layer 24, source/drain electrodes 25, a protective layer 26 and a pixel electrode 27. With respect to the base substrate 20, the etch stop layer 24 comprises a bottom etch stop layer as the bottom insulating sub-layer 24a and a top etch stop layer as the top insulating sub-layer 24b, and the top etch stop layer 24b has a hydrogen content higher than that of the bottom etch stop layer 24a.

The etch stop layer will be doped with hydrogen ions during the manufacturing process. In order to maintain the hydrogen content at a low level, the flow rate of the silane gas shall be reduced, which however will affect the speed of depositing the thin film; if a higher speed of depositing the thin film is maintained, the hydrogen content in the thin film will be increased. So, if the etch stop layer in the two layer structure is manufactured such that the upper layer has a higher hydrogen content and the lower layer has a lower hydrogen content, the influence of the hydrogen ions in the etch stop layer on the oxide semiconductor active layer can be lowered while the deposition speed is not affected.

For example, the hydrogen content in the top etch stop layer 24b may be 5%~10%, and the hydrogen content in the bottom etch stop layer 24a may be 1%~5%.

Under the condition of the exemplary hydrogen content, the oxide thin film transistor to be manufactured will have a better performance while the deposition speed may be optimized.

As shown in FIG. 3, the gate electrode 21 is formed on the base substrate 20; the gate insulating layer 22 covers the base substrate 20 and the gate electrode 21; the active layer 23 is formed on the gate insulating layer 22 corresponding to the gate electrode 21; the bottom etch stop layer 24a is formed on the active layer 23; the top etch stop layer 24b is formed on the bottom etch stop layer 24a; the source/drain electrodes 25 are formed on the top etch stop layer 24b; the protective layer 26 covers the gate insulating layer 22, the source/drain electrodes 25 and the top etch stop layer 24b; and the pixel electrode 27 is formed on the source/drain electrodes 25 and the protective layer 26.

In order to improve the properties of the oxide thin film transistor, the above embodiment adopts a double-layered etch stop layer, i.e., the bottom etch stop layer 24a and the top etch stop layer 24b are respectively disposed. In forming of the bottom etch stop layer 24a, a lower deposition temperature and a lower silane gas flow rate are adopted so that the content of hydrogen ions generated by silane decomposition in the reaction gas is reduced, thereby avoiding the properties of the oxide thin film transistor from being disadvantageously affected by the reaction between hydrogen ions and In, Zn, O and etc. in metal oxides such as IGZO in the active layer. In forming of the top etch stop layer 24b, a higher deposition temperature and a higher silane gas flow rate are adopted, the silane in the reaction gas is sufficiently decomposed because of the higher deposition temperature. In addition, although the deposition temperature and the silane gas flow rate are higher such that the hydrogen ion concentration generated by the silane decomposition is higher, the bottom etch stop layer 24a prevents the contact between the metal oxides such as IGZO in the active layer and the hydrogen ions so as to avoid the hydrogen ions from reacting with the In, Zn, O and etc. in the metal oxides such as IGZO. In this case, the properties of the oxide thin film transistor will not be disadvantageously affected while the hydrogen content in the top etch stop layer 24b is higher than the hydrogen content in the lower etch stop layer 24a. Therefore, the hydrogen content in the silicon oxide thin film is effectively lowered, the oxide thin film transistor maintains good properties and improved stability, and the deposition rate of the etch stop layer thin film is improved as well.

What is needed to be explained is that both the reaction temperature and the silane gas flow rate in the reaction gas will affect the hydrogen content generated by silane decomposition in the reaction gas when the etch stop layer is deposited. When the reaction temperature is constant, the lower the silane gas flow rate is, the more sufficiently the silane is decomposed, the lower the hydrogen content in the formed silicon oxide thin film is, but the deposition rate will be lowered accordingly. On the other hand, when the reaction temperature is constant, although a higher silane gas flow rate can help to improve the deposition rate, it is easy to cause insufficient decomposition of the silane gas and is unfavorable to lower the hydrogen content in the silicon oxide thin film. Therefore, the silane gas flow rate shall be appropriately determined according to the temperature and the practical requirements of production. Moreover, when the silane gas flow rate is constant, the higher the temperature is, the more sufficiently the silane is decomposed, the more hydrogen ions are generated, and the quick the deposition rate is. But it is easy to cause reaction between the hydrogen ions and the In, Zn, O and etc. in the metal oxides such as IGZO, thus disadvantageously affecting the properties of the oxide thin film transistor. Therefore, the deposition rate and the properties of the thin film shall be taken into comprehensive consideration, and the reaction temperature and the silane gas flow rate in the reaction gas shall be appropriately set.

On the basis of taking the deposition rate and the properties of the thin film into comprehensive consideration, one example in the embodiment of the present technical disclosure sets the deposition temperature of the bottom etch stop layer to be 200-300° C., preferably 250° C., the silane gas flow rate to be 300-800 sccm (standard cubic centimeter per minute), preferably 600 sccm, and the deposition power to be 6000 W, such that the hydrogen content generated by silane decomposition in the reaction gas is lowered and the hydrogen ions are prevented from reacting with the In, Zn, O and etc. in the metal oxides such as IGZO in the active layer. For the top etch stop layer, the deposition temperature is set to be 240-340° C., preferably 290° C., such that the silane in the reaction gas may be decomposed more sufficiently and the hydrogen content in the oxide thin film may be lowered. The silane gas flow rate may be determined according to the practical requirements of product, and higher silane gas flow rate may help to improve the deposition rate of the thin film. In order to improve the deposition rate of the thin film, in one example of the embodiments of the present technical disclosure, the silane gas flow rate is 600-1200 sccm, preferably 900 sccm, and the deposition rate is 3500 W.

By the above setting of the process conditions, the embodiments of the present technical disclosure can reduce the hydrogen content in the silicon oxide thin film in the bottom etch stop layer to about 3%, and reduce the hydrogen content in the silicon oxide thin film in the top etch stop layer to about 5% (the traditionally manufactured silicon oxide thin film has a hydrogen content of about 6%).

Furthermore, the setting of the thickness of the bottom etch stop layer or the top etch stop layer also affects the overall deposition rate and the properties of the etch stop layer thin film. The embodiments of the present technical disclosure take the deposition rate and the properties of the thin film into comprehensive consideration, for example, the bottom etch stop layer has a thickness of 200-1000 Å, preferably 500 Å, and the top etch stop layer has a thickness of 1000-1500 Å, preferably 1500 Å.

In addition, in order to improve adhesion between the silicon oxide thin film and the photoresist, for example, an adhesive layer (not shown) may be further added between the top etch stop layer and photoresist applied for patterning; and the adhesive layer usually is a layer of silicon nitride thin film of several hundred angstroms.

The thin film in each layer in the oxide thin film transistor of the present technical disclosure may be manufactured by the traditional methods and materials for thin films. For example, the gate electrode may be made of a single-layer film of AlNd, Al, Cu, Mo, MoW or Cr, or a composite film of any combination of AlNd, Al, Cu, Mo, MoW or Cr; the gate insulating layer may by made of a thin film of silicon nitride ($SiN_x$) or silicon oxide ($SiO_2$); the active layer may be made of indium zinc oxide (IZO) or doped IZO (e.g., indium gallium zinc oxide (IGZO)) semiconductor by magnetron sputtering.

Figure 4:
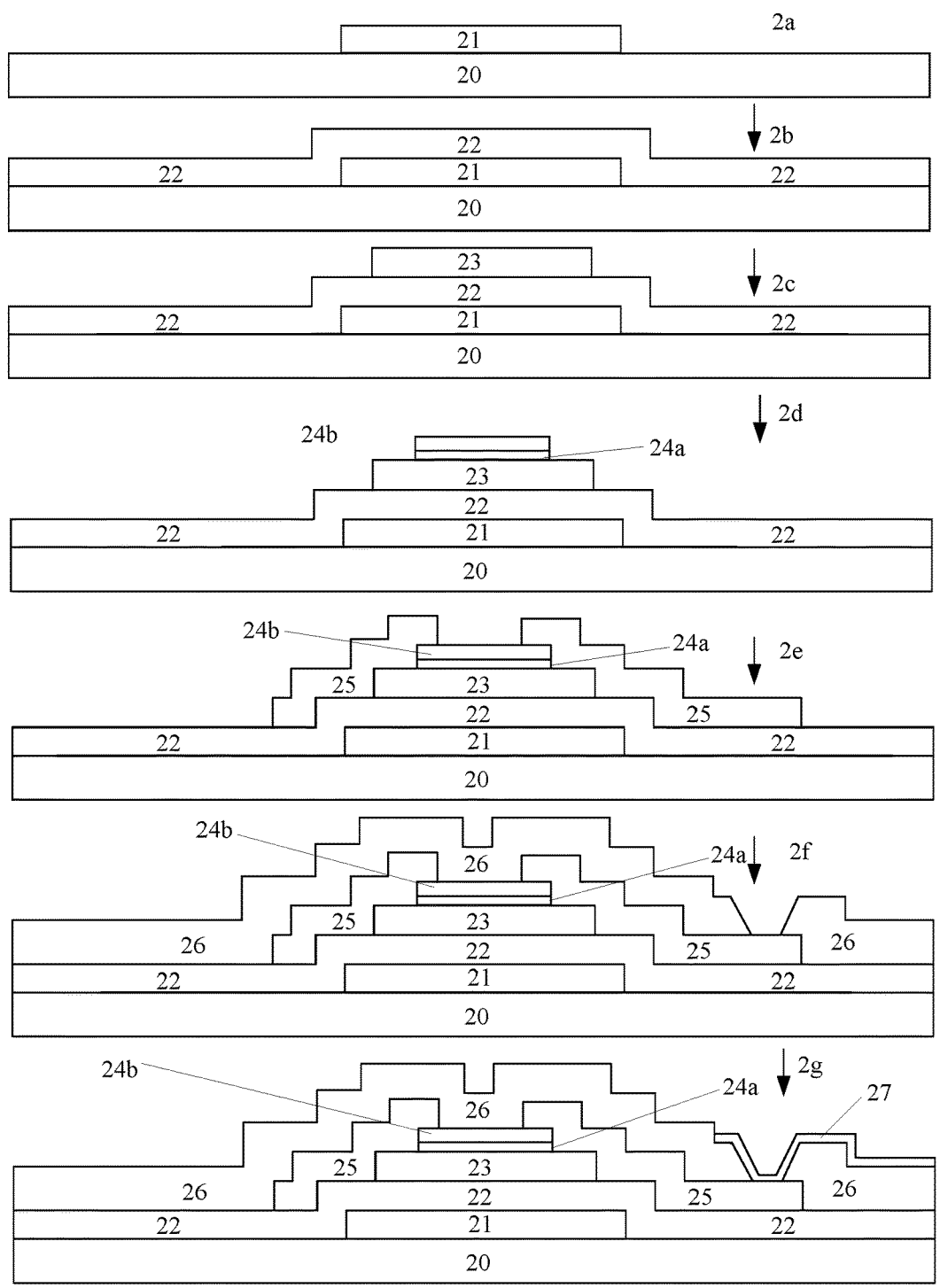
FIG. 4 is a schematic flow chart of manufacturing the oxide thin film transistor according to an embodiment of the present technical disclosure.

In order to realize the aforementioned oxide thin film transistor, another embodiment of the present technical disclosure provides a method of manufacturing an oxide thin film transistor. As shown in FIG. 4, the manufacturing method of the present technical disclosure comprises the following steps:

Step 2a: forming a gate electrode 21 on a substrate;

Step 2b: fainting a gate insulating layer 22 covering the substrate 20 and the gate electrode 21;

Step 2c: forming an active layer 23 on the gate insulating layer 22 corresponding to the gate electrode 21;

Step 2d: forming a bottom etch stop layer 24a on the active layer 23;

Step 2e: forming a top etch stop layer 24b on the bottom etch stop layer 24a;

Step 2f: forming source/drain electrodes 25 on the top etch stop layer 24b;

Step 2g: forming a protective layer 26 covering the gate insulating layer 22, the source/drain electrodes 25 and the top etch stop layer 24b; and Step 2h: forming a pixel electrode 27 on the source/drain electrodes 25 and the protective layer 26.

The above steps are shown as steps 2a-2g in FIG. 4 correspondingly.

The thin film of the aforementioned each layer may be manufactured by the traditional methods and materials for thin films. For example, in step 2a, the gate electrode may be made of a single-layer film of AlNd, Al, Cu, Mo, MoW or Cr, or a composite film of any combination of AlNd, Al, Cu, Mo, MoW or Cr; for example, in step 2b, the gate insulating layer may by made of a thin film of silicon nitride (SiNx) or silicon oxide ($SiO_2$); for example, in step 2c, the active layer may be made of indium gallium zinc oxide (IGZO) or indium zinc oxide (IZO) semiconductor by magnetron sputtering.

Furthermore, the embodiments of the present technical disclosure take the influence of the deposition temperature, the saline gas flow rate and the thin film deposition thickness on the properties and the deposition rate of oxide thin film transistor into comprehensive consideration. In one example, for example, in step 2d, the deposition temperature of the bottom etch stop layer is 200-300° C., preferably 250° C., for example, the silane gas flow rate is 300-800 sccm, preferably 600 sccm, the deposition power is 6000 W, and the deposition thickness is 200-1000 Å, preferably 500 Å; for example, in step 2e, the deposition temperature of the top etch stop layer is 240-340° C., preferably 290° C., for example, the silane gas flow rate is 600-1200 sccm, preferably 900 sccm, the deposition power is 3500 W, and the deposition thickness is 1000-1500 Å, preferably 1500 Å.

In addition, in order to improve adhesion between the silicon oxide thin film and the photoresist applied for patterning, for example, an adhesive layer (not shown) may be added between the top etch stop layer and the photoresist; and the adhesive layer usually is a layer of silicon nitride thin film of several hundred angstroms.

Figure 1:
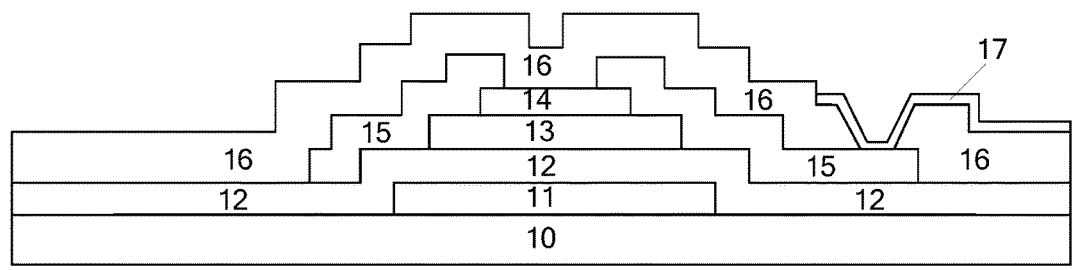
FIG. 1 is a structural schematic view of a traditional oxide thin film transistor.
Figure 2:
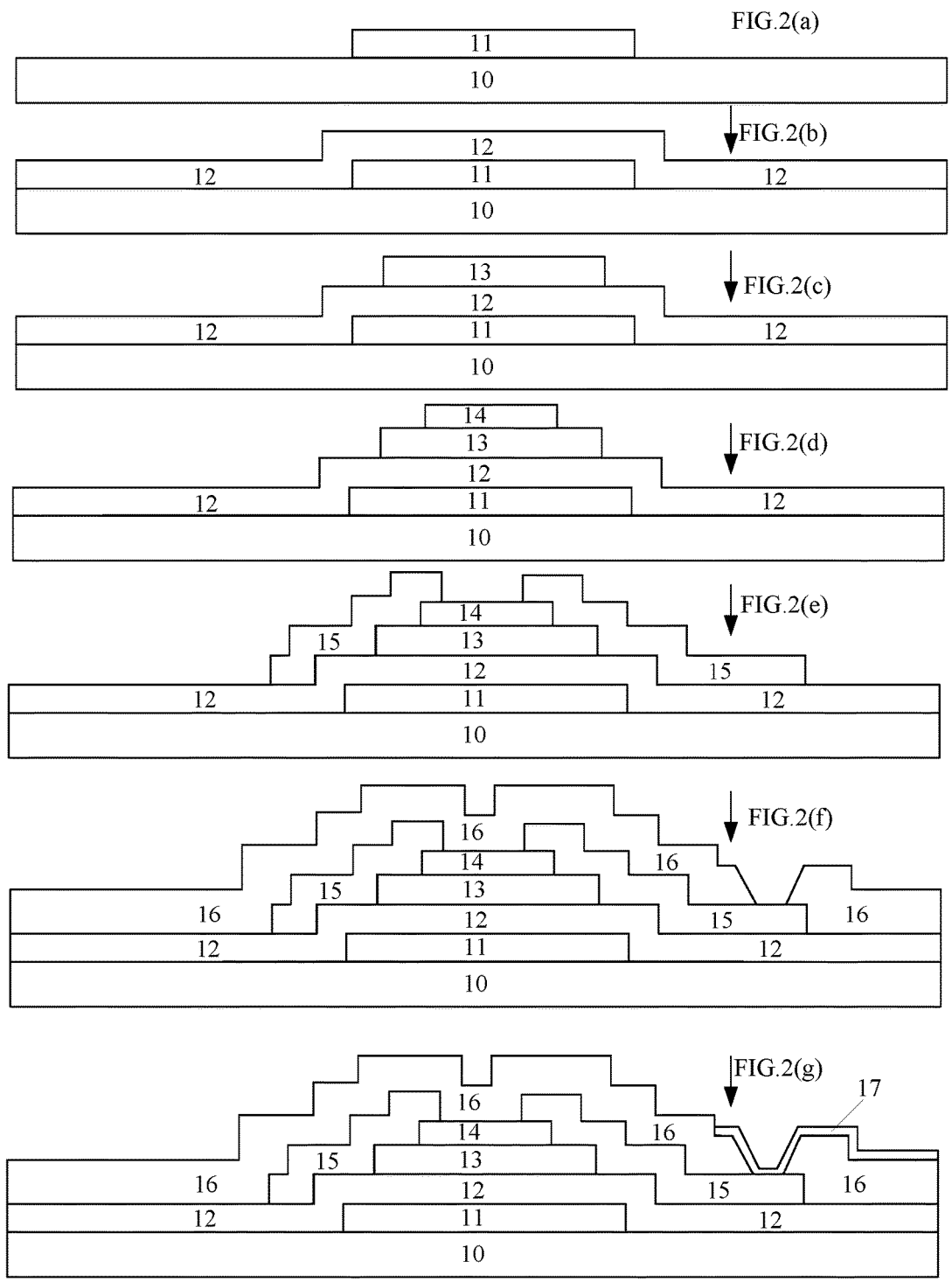
FIGS. 2 (a)-2 (g) are schematic flow charts of manufacturing the traditional oxide thin film transistor.

Compared with the traditional process shown in FIGS. 2 (a)-2 (g), the thin film transistor provided by the embodiments of the present technical disclosure manufacture etch stop layer with a double-layered structure, which has the following advantages: (1) in the process of manufacturing the bottom etch stop layer, although a deposition temperature lower than that of the traditional process is used, the lower silane gas flow rate is adopted such that the silane decomposition is more sufficient; furthermore, the flow rate in the bottom etch stop layer is lower than that in the top etch stop layer such that the concentration of the hydrogen ions generated by the silane decomposition in the bottom layer is lower than that of the upper insulating layer, whereby the hydrogen content in the etch stop layer is further reduced;

(2) when the top etch stop layer is deposited, the bottom etch stop layer can prevent the generated hydrogen ions from reacting with the metal oxide in the active layer, such that the top etch stop layer can be deposited at a high temperature and a high silane gas flow rate. Therefore, the reaction between the hydrogen ions generated by silane decomposition and the metal oxide in the active layer is prevented, and the deposition rate of the etch stop layer thin film is improved.

The above description takes the etch stop layer in the oxide thin film transistor for example to illustrate the thin film transistor and the manufacturing method thereof in the embodiments of the present technical disclosure. It shall be noted that the aforementioned process parameters comprising temperature, gas flow rate, deposition power, thickness of the thin film and etc. are all exemplary process parameters, and the embodiments of the present technical disclosure are not limited thereto. Those skilled in the art are able to adjust the process parameters according to the practical needs.

In addition, the process of manufacturing the insulating layer with a double-layered structure in the embodiments of the present technical disclosure shall not be limited to the etch stop layer made of e.g., silicon oxide in the oxide thin film transistor, it is also applied to the protective layer made of e.g., silicon oxide in the oxide thin film transistor, or the etch stop layer or the protective layer made of e.g., silicon nitride in the oxide thin film transistor or amorphous silicon thin film transistor. The specific principles are similar to those of the etch stop layer in the oxide thin film transistor, so no more details are dealt with herein.

A further embodiment of the present technical disclosure provides an array substrate, which comprises the aforementioned thin film transistor, the thin film transistor for example serving as a switch element of a pixel unit. For example, the array substrate of the embodiment comprises a plurality of gate lines and a plurality of data lines which intersect each other to define pixel units arranged in a matrix, each pixel unit comprising a thin film transistor as a switch element, and a pixel electrode for controlling orientation of liquid crystal. For example, a gate electrode of the thin film transistor in each pixel is electrically connected to or integrally formed with a corresponding gate line, a source electrode thereof is electrically connected to or integrally formed with a corresponding data line, and a drain electrode thereof is electrically connected to or integrally formed with a corresponding pixel electrode.

A further embodiment of the present technical disclosure provides a display device, which comprises the aforementioned array substrate. For example, the display device may be a liquid crystal display, an organic light emitting diode (OLED) display, and so on.

In the liquid crystal display, the array substrate and an opposed substrate are disposed opposite to each other so as to form a liquid crystal cell, and a liquid crystal material is filled in the liquid crystal cell. The opposed substrate is, for example, a color filter substrate. In some examples, the liquid crystal display device further comprises a backlight module used to provide light source for the array substrate. In the OLED, the lamination of organic light emitting materials is formed on the array substrate, and the pixel electrode in each pixel unit is used as anode or cathode for driving the organic light emitting materials to emit light, so as to conduct a display operation.

The above embodiments of the present technical disclosure are preferable embodiments only and thus are not limitative of the protection scope of the present technical disclosure.

What is claimed is:

1. A method of manufacturing a thin film transistor, comprising: forming a gate electrode, an active layer, source/drain electrodes, one or more insulating layers and a pixel electrode on a base substrate,
   wherein at least one of the insulating layers comprises a silicon oxide sub-layer contacting the active layer and a silicon oxide sub-layer not contacting the active layer, and the silicon oxide sub-layer not contacting the active layer has a hydrogen content higher than that of the silicon oxide sub-layer contacting the active layer, and
   wherein the method comprising: depositing the silicon oxide sub-layer contacting the active layer at 200-300° C. with a silane gas flow rate of 300-800 sccm and depositing the silicon oxide sub-layer not contacting the active layer at 240-340° C. with a silane gas flow rate of 600-1200 sccm, in order that the hydrogen content of the silicon oxide sub-layer not contacting the active layer is 5%~10%, and the hydrogen content of the silicon oxide sub-layer contacting the active layer is 1%~5%.

2. The manufacturing method according to claim 1, wherein
   the thin film transistor is an oxide thin film transistor, the at least one of the insulating layers comprises an etch stop layer, and the manufacturing method comprises: sequentially forming the gate electrode, a gate insulating layer, the active layer, the etch stop layer, the source/drain electrodes, a protective layer, and the pixel electrode on the base substrate, and
   a bottom etch stop layer as the silicon oxide sub-layer contacting the active layer and a top etch stop layer as the silicon oxide sub-layer not contacting the active layer are sequentially formed during forming the etch stop layer such that the top etch stop layer has a hydrogen content higher than that of the bottom etch stop layer.

3. The manufacturing method according to claim 2, comprising:
   forming the gate electrode on the base substrate;
   forming the gate insulating layer covering the base substrate and the gate electrode;
   forming the active layer on the gate insulating layer corresponding to the gate electrode;
   forming the bottom etch stop layer on the active layer;
   forming the top etch stop layer on the bottom etch stop layer;
   forming the source/drain electrodes on the top etch stop layer;
   forming the protective layer covering the gate insulating layer, the source/drain electrodes and the top etch stop layer; and
   forming the pixel electrode on the source/drain electrodes and the protective layer.

4. The manufacturing method according to claim 2, wherein the active layer is made of indium gallium zinc oxide semiconductor or indium zinc oxide semiconductor.

5. The manufacturing method according to claim 2, wherein the active layer is deposited by magnetron sputtering.

6. The manufacturing method according to claim 1, wherein the silicon oxide sub-layer contacting the active layer is deposited at 250° C. with a silane gas flow rate of 600 sccm; the silicon oxide sub-layer not contacting the active layer is deposited at 290° C. with a silane gas flow rate of 900 sccm.

7. The manufacturing method according to claim 1, wherein a thickness of the silicon oxide sub-layer contacting the active layer is smaller than a thickness of the silicon oxide sub-layer not contacting the active layer.

8. The manufacturing method according to claim 1, wherein the silicon oxide sub-layer contacting the active layer is deposited with a thickness of 200-1000 Å, and the silicon oxide sub-layer not contacting the active layer is deposited with a thickness of 1000-1500 Å.

9. The manufacturing method according to claim 1, wherein the silicon oxide sub-layer contacting the active layer is deposited with a thickness of 500 Å, and the silicon oxide sub-layer not contacting the active layer is deposited with a thickness of 1500 Å.

10. A method of manufacturing a thin film transistor, comprising: forming a gate electrode, an active layer, source/drain electrodes, one or more insulating layers and a pixel electrode on a base substrate,
    wherein at least one of the insulating layers comprises a silicon oxide sub-layer contacting the active layer and a silicon oxide sub-layer not contacting the active layer, and the silicon oxide sub-layer not contacting the active layer has a hydrogen content higher than that of the silicon oxide sub-layer contacting the active layer,
    wherein the method comprising: depositing the silicon oxide sub-layer contacting the active layer at 200-300° C. with a silane gas flow rate of 300-800 sccm and depositing the silicon oxide sub-layer not contacting the active layer at 240-340° C. with a silane gas flow rate of 600-1200 sccm, in order that the hydrogen content of the silicon oxide sub-layer not contacting the active layer is 5%~10%, and the hydrogen content of the silicon oxide sub-layer contacting the active layer is 1%~5%, and
    wherein a thickness of the silicon oxide sub-layer contacting the active layer is smaller than a thickness of the silicon oxide sub-layer not contacting the active layer.

* * * * *